United States Patent [19]

White et al.

[11] Patent Number: 5,345,118
[45] Date of Patent: Sep. 6, 1994

[54] PRECISION MOS RESISTOR

[75] Inventors: Bert White; Mehrdad Negahban-Hagh, both of Irvine, Calif.

[73] Assignee: Silicon Systems, Inc., Tustin, Calif.

[21] Appl. No.: 873,948

[22] Filed: Apr. 23, 1992

Related U.S. Application Data

[63] Continuation of Ser. No. 581,722, Sep. 11, 1990, abandoned.

[51] Int. Cl.$^5$ .............................................. H03K 3/353
[52] U.S. Cl. ................................... 307/501; 307/304; 307/490; 307/491; 307/571; 307/585
[58] Field of Search ................... 307/296.8, 264, 304, 307/490, 491, 501, 512, 585, 571

[56] References Cited

U.S. PATENT DOCUMENTS

| | | | |
|---|---|---|---|
| 3,739,195 | 6/1973 | Fidi et al. | 307/229 |
| 4,071,778 | 1/1978 | Nakagomi | 307/490 |
| 4,288,707 | 9/1981 | Katakura | 307/264 |
| 4,395,643 | 7/1983 | Lehmann | 307/264 |
| 4,517,508 | 5/1985 | Sakai | 323/352 |
| 4,529,897 | 7/1985 | Suzuki et al. | 307/571 |
| 4,877,980 | 10/1989 | Kubinec | 307/542 |
| 5,045,832 | 9/1991 | Tam | 338/334 |
| 5,065,057 | 11/1991 | Kawasaki | 307/572 |

Primary Examiner—Timothy P. Callahan
Assistant Examiner—Terry D. Cunningham
Attorney, Agent, or Firm—Hecker & Harriman

[57] ABSTRACT

A precision resistor using MOS devices. The present invention utilizes an NMOS resistive element to simulate the resistor. A pair of PMOS source followers are implemented to control the value of the resistor and cancel the non-linearity due to the drain-source voltage $V_{ds}$. A pair of NMOS source followers serve to eliminate non-linear distortions due to the "body effect" that can exist in the resistive element. The resistor circuit of the present invention provides higher precision, linearity and high value resistors in a smaller area than prior art MOS resistors.

47 Claims, 2 Drawing Sheets

PRECISION MOS RESISTOR

This is a continuation of application Ser. No. 07/581,722 filed Sep. 11, 1990, now abandoned.

BACKGROUND OF THE PRESENT INVENTION

1. Field of the Invention

This invention relates to the field of precision resistor circuits using MOS transistors.

2. Background Art

Precision resistors are often used in integrated circuit applications that require high stability and accuracy. For these applications, normal resistors are not employed since their tolerance ratings are too poor. Normal diffused resistors in IC technology are usually formed with doped silicon or polysilicon. An example of the processing of a prior art diffused resistor is given in the following explanation. On an n-type silicon substrate, a p-well is diffused into the epitaxial layer and then a silicon dioxide layer is grown on the surface of the epitaxial layer. Contact areas are opened at the ends of the p-well of uniform resistivity. The p-well is L cm long, W cm wide and t cm thick. Thus, the resistance of the diffused layer is:

$$R = \frac{\rho L}{tw} \, \Omega$$

where $\rho$ = resistivity of the material $\Omega$·cm.

Due to processing variations, the length, width, thickness and resistivity of prior art resistors cannot be controlled with enough precision to fabricate resistors of high precision. Thus, prior art resistors have required the use of well-known techniques such as "laser-trimming" in order to adjust resistor dimensions and thus adjust the resistance level to the desired value. However, performance of these resistors can suffer if the trimming process is not tightly controlled. In addition, laser trimming is a post processing technique, and adds to the expense of manufacture of integrated circuits.

Thus, it is an object of the present invention to provide a precision resistor that does not require any post-processing.

It is another object of the present invention to provide a voltage-controlled variable precision resistor.

It is another object of the present invention to provide high value impedance in a small area.

SUMMARY OF THE PRESENT INVENTION

The present invention simulates a precision resistor using MOS devices. The invention utilizes an "impedance element" comprising a pair of NMOS transistors, drain coupled and source coupled to simulate a resistor. A pair of PMOS source followers are implemented to control the value of the resistor and cancel the non-linearity due to the drain-source voltage $V_{ds}$. A pair of NMOS source followers serve to eliminate non-linear distortions due to the "body effect" that can exist in the resistive element. The resistor circuit of the present invention provides higher precision, linearity, and high value resistors in a smaller area than prior art precision resistors. The present invention can be used in many applications including gain setting, automatic gain control circuits and filters.

In each of the two-transistor source followers of the present invention, one transistor acts as a buffer amplifier while the other transistor acts as a variable resistive load dependent on its gate biasing. The gates of the PMOS source follower resistive loads are coupled to an input voltage Bias P and the gates of the NMOS source follower resistive loads are coupled to an input voltage bias N. A third input voltage is coupled to the gates of one PMOS buffer amplifier and one NMOS buffer amplifier and the drain of the NMOS resistive element. A fourth input voltage is coupled to the gates of the other PMOS and NMOS buffer amplifier as well as the source of the NMOS resistive element. The outputs of the PMOS source followers are coupled to the gates of the resistive element and, along with the drain and source voltages, will control the amount of current that travels through the resistive element. The use of PMOS source followers eliminates non-linear distortion due to a squared dependency on the drain-source voltage. The outputs from the NMOS source followers are coupled to the body terminals of the NMOS resistive element. The present invention provides this coupling to ensure that the body-source junction has a constant reverse-bias so non-linearity due to the "body effect" will not occur.

DETAILED DESCRIPTION OF THE PRESENT INVENTION

A precision resistor simulated by MOS transistors is described. In the following description, numerous specific details, such as number of transistors, conductivity type, voltage levels, etc., are described in order to provide a more thorough description of the present invention. It will be apparent, however, to one skilled in the art, that the present invention may be practiced without these specific details, In other instances, well known features have not been described in detail so as not to obscure the invention.

Figure 1:
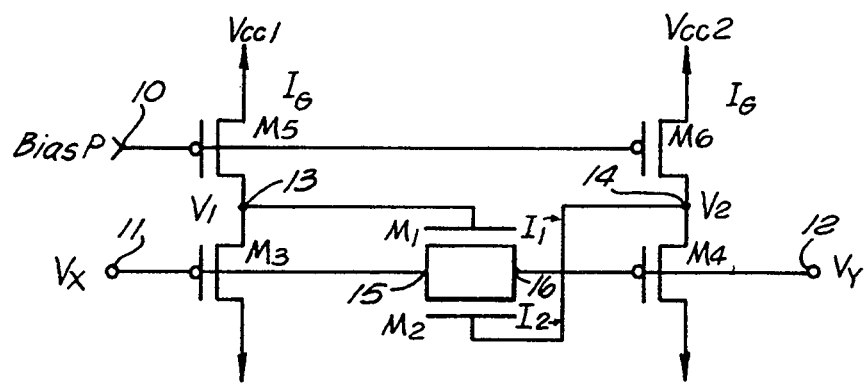
FIG. 1 is a circuit diagram of a precision resistor simulated by an MOS transistor.

An example of the present invention is illustrated in FIG. 1. The present invention is implemented with two PMOS source followers and two NMOS transistors, drain-coupled and source-coupled which make up the resistive element. Transistors M3 and M5 make up one source follower and transistors M6 and M4 make up the other source follower. Transistors M1 and M2 form the resistive element. The source followers have current $I_G$ passing through depending on the input voltages Bias P, $V_x$ and $V_y$.

A voltage input 10 Bias P is coupled to the gates of PMOS transistors M5 and M6. The source of transistor M5 is coupled to $V_{CC1}$ and the drain of transistor M5 is coupled to the source of PMOS transistor M3 at node 13. Also coupled to node 13 is the gate of NMOS transistor M1. Transistor M1 forms a resistive element with NMOS transistor M2. The drains of transistors M1 and M2 at node 15 and the gate of transistor M3 are coupled to voltage input 11 ($V_x$). The drain of transistor M3 is coupled to ground. Voltage input 12 ($V_y$) is coupled to the gate of PMOS transistor M4 and also coupled to the sources of resistive element transistors M1 and M2 at node 16.

At node 14, the gate of transistor M2 is coupled to the drain of PMOS transistor M6 as well as coupled to the source of the PMOS transistor M4. The source of transistor M6 is coupled to the voltage supply $V_{CC2}$. The drain of transistor M4 is coupled to ground.

The precision resistor is simulated by the NMOS resistive element which is controlled by the input voltage signals Bias P, $V_x$ and $V_y$. The current that flows through the resistive element is dependent upon the gate voltages $V_1$ and $V_2$ of transistors M1 and M2. The values of the gate voltages $V_1$ and $V_2$ are dependent on the input voltages Bias P, $V_x$ and $V_y$.

Since transistors M5 and M3 form a PMOS source follower, the AC output voltage is the same as input voltage $V_x$. Transistor M5 is biased enough by input voltage Bias P that the output voltage $V_1$ rises to a level between $V_{CC1}$ and $V_x$. In the case where $V_x > V_y$, $V_x$ is the drain voltage of the resistive element and $V_y$ is the source voltage of the resistive element. In this case, $V_1$ is biased to a high enough level so that $V_1 > V_x + V_T$ (where $V_T$ is the threshold voltage). This is done to ensure that the resistance in the resistive element remains linear. If $V_1 < V_x + V_T$, then the resistive element is in the saturation region, compromising precision. Thus, the resistance in transistor M1 is dependent on the drain-source voltage $(V_x - V_y)$ as well as the current $I_1$.

Transistor M2 of the resistive element follows a similar analysis. Output voltage $V_2$ of the second follower is similarly biased at a level between $V_y$ and voltage supply $V_{CC2}$. Output voltage $V_2$ is the gate voltage of transistor M2. The gate voltage is already known to be greater than source voltage $V_2$ so transistor M2 is already turned on. For transistor M2 to remain in the linear region, however, $V_2 > V_x + V_T$. Therefore, careful biasing of $V_2$ by Bias P and $V_y$ is necessary. By doing this, a current $I_2$ linearly proportional to the drain-source voltage is realized.

Taking the voltage difference $(V_x - V_y)$ and dividing by the total current $(I_1 + I_2)$ gives the precision resistance value of the circuit. Similar analysis of the case where $V_y > V_x$ illustrates similar results in the present invention.

The precision resistance value depends on the quantity $(V_x - V_y)$ as shown in the following analysis which describes the current equations of the two source followers which bias the impedance element. The analysis also describes the current equations for the impedance element.

The current equations below are for the two source followers which operate in the saturation region.

$$I_G = K_p(V_y - V_2 - V_{TP})^2 \quad K_p = 0.5 K_p'$$
$$I_G = K_p(V_x - V_1 - V_{TP})^2$$

The standard equation for saturation current in PMOS is:

$I_G = K_P(V_{SG} - V_{TP})^2$ where the source-gate voltage $V_{SG}$ in the two source followers are $(V_y - V_2)$ and $(V_x - V_1)$.

The equation below sets the source-gate voltages to a new variable, $V_z$.

$$V_y - V_2 = V_x - V_1 = \sqrt{\frac{I_G}{K_p}} + V_{TP} \stackrel{\Delta}{=} V_z$$
$$V_1 = V_x - V_z$$
$$V_2 = V_y - V_z$$

The current equations below are for the two NMOS transistors in the impedance element which operate in the linear region. The standard equation for the linear current is $I_G = K_n'(V_{GS} - V_{TN} - \frac{1}{2} V_{DS}) V_{DS}$ where the drain source voltage is $(V_x - V_y)$.

$$I_1 = K_n'(V_1 - V_y - V_{TN} - \tfrac{1}{2} V_x + \tfrac{1}{2} V_y)(V_x - V_y)$$
$$I_2 = K_n'(V_2 - V_y - V_{TN} - \tfrac{1}{2} V_x + \tfrac{1}{2} V_y)(V_x - V_y)$$
$$I = I_1 + I_2 = K_n'(V_1 + V_2 - V_y - V_x - 2V_{TN})(V_x - V_y)$$

This is the total current passing through the impedance element.

$$I = -2K_n'(V_z + V_{TN})(V_x - V_y)$$

Substitution of $V_z$ into current equation.

$$V_c \stackrel{\Delta}{=} -(V_z + V_{TN})$$

Definition of new variable $V_c$.

$V_c \stackrel{\Delta}{=}$ controlled voltage $$G = \frac{I}{V_x - V_y} = 2k_n' V_c$$

$$G = \frac{1}{R}$$

The previous analysis illustrates that during normal operation of the circuit, the two source followers are in the saturation region and the resistive element is in the triode (linear) region. In prior art, MOS resistors suffer from non-linearity due to the extra squared dependency on the drain-source voltage ($\tfrac{1}{2} V_{DS}^2$). By implementation of the present invention, this non-linear factor is cancelled out by the addition of $I_1$ and $I_2$. This gives:

$$R = \frac{1}{2K_n(V_z + V_{TN})}$$

Now, resistance linearly dependent upon the voltage in MOS transistors Q1 and Q2 can be achieved. High values of resistance can be attained by making the value $K_n'$ small.

In MOS transistors, the body terminal will act as a second gate terminal which will give rise to another drain current component. This additional current component is undesirable in MOS resistors since it will causes non-linearity in the resistor.

Figure 2:
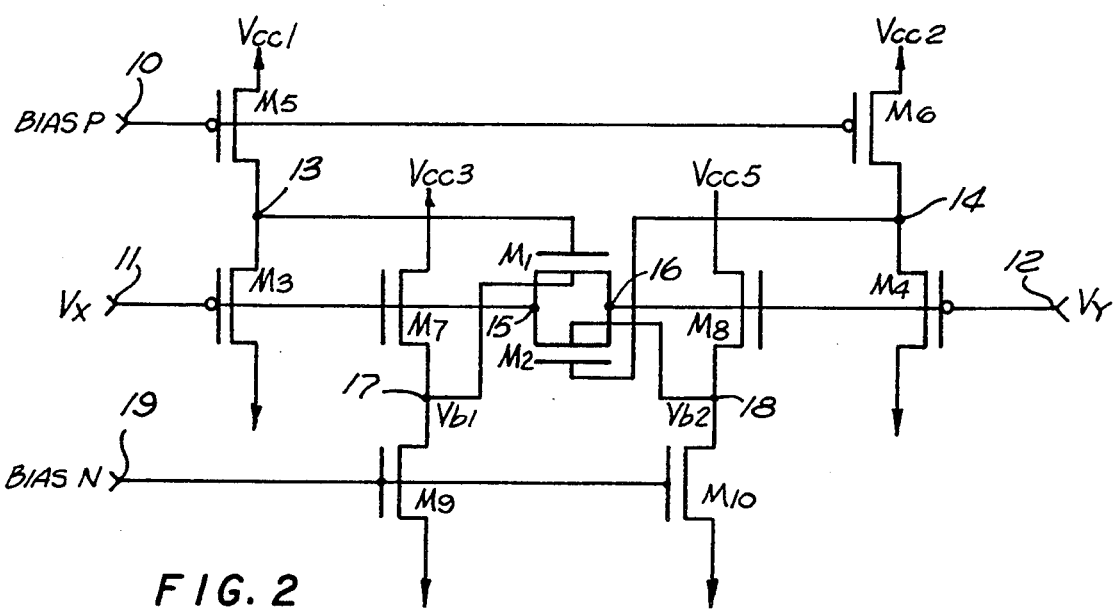
FIG. 2 is a circuit diagram of the preferred embodiment of the present invention.

The embodiment of the present invention illustrated in FIG. 2 eliminates this problem by utilizing two NMOS source followers to force the body voltage level below the source voltage level. This embodiment includes two NMOS transistor source followers to minimize the non-linearity due to the "body effect" of the transistors in the resistive element. The gate of the NMOS transistor M7 is coupled to the gate of transistor M3, the drains of transistors M1 and M2, and input voltage 11 ($V_x$) at node 15. The drain of transistor M7 is coupled to $V_{CC3}$. The source of transistor M7 is coupled to the drain of NMOS transistor M9 as well as coupled to the body of transistor M1 at node 17. The gate of transistor M9 is coupled to input voltage bias N 19. The source of transistor M9 is coupled to ground. The gate of NMOS transistor M8 is coupled to the gate of transistor M4, the sources of transistors M1 and M2 and the input voltage $V_y$ at node 16. The drain of transistor M8 is coupled to $V_{CC4}$. The source of transistor M8 is coupled to the drain of NMOS transistor M10 as well as the body of transistor M2 at node 18. The gate of transistor M10 is coupled to the gate of transistor M9 and input voltage bias N at node 19. The source of transistor M10 is coupled to ground.

Transistors M7 and M9 make up one NMOS source follower. Transistors M8 and M10 make up the other source follower. With the first source follower of transistors M7 and M9, node 17 has the same AC voltage as input voltage $V_x$ since source followers have virtual unity gain. In this circuit, however, voltage level bias N is high enough so that the voltage level at node 17 is pulled down to a level between Vx and ground. This is the body voltage of transistor M1. If $V_x<V_y$, then Vx gives the voltage of the sources of the resistive element transistors. In this case, a reverse bias of the substrate diode is achieved since the body voltage is less than $V_x$. If $V_y<V_x$, then $V_y$ gives the voltage of the sources of the resistive element transistors.

To ensure that $V_1<V_y$, bias N is such that transistor M9 pulls down $V_1$ below $V_y$. Thus, for either case, the body-source voltage is reverse-biased and held constant and the "body effect" problem is resolved. Similar analysis of the other NMOS source follower coupled to transistor M2 illustrates similar results in the present invention. This improvement to the resistor gives a more precise linearity than previous MOS resistor circuits.

Figures 3, 4:
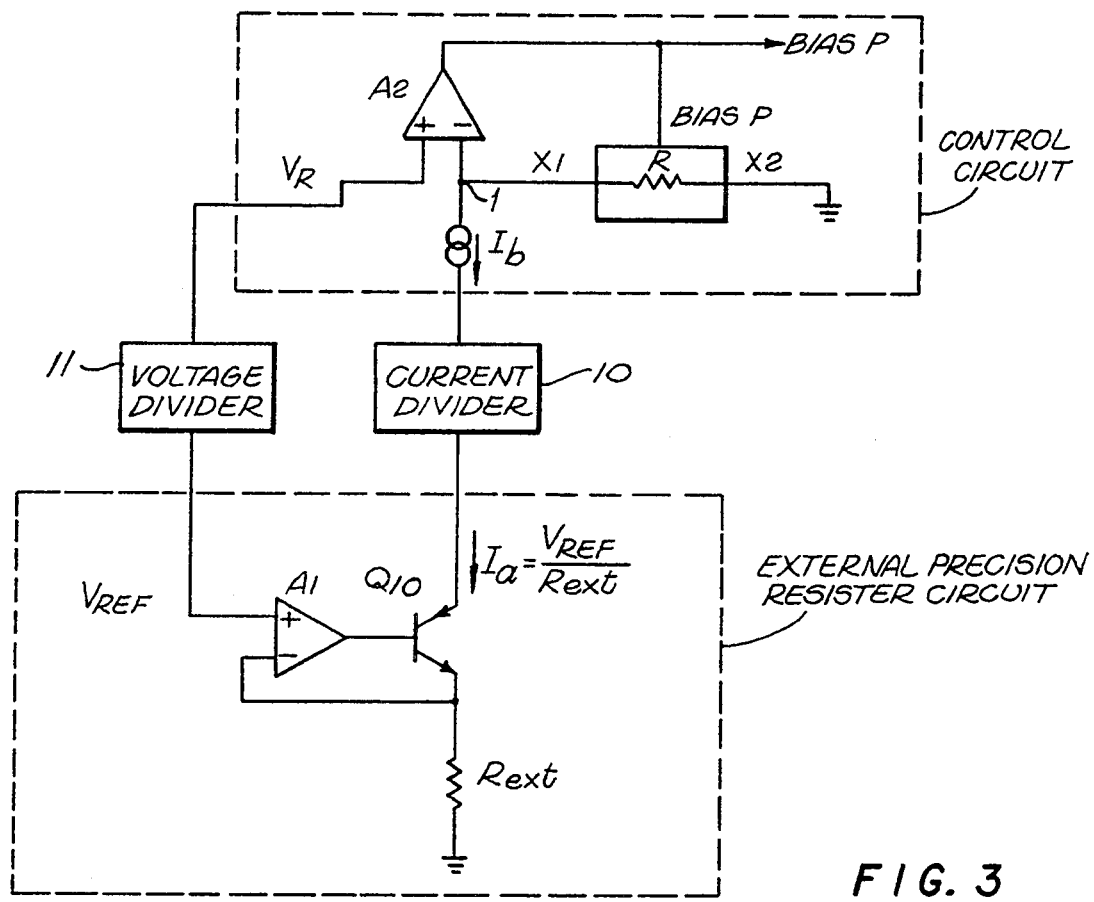
FIG. 3 is a circuit diagram of the control circuitry used to match the desired resistance value.
FIG. 4 is a cascade of two MOS precision resistors.

An example of how to attain a desired resistance value using control circuitry is illustrated in FIG. 3. The desired resistance value can be matched by an external precision resistor.

The output terminal of amplifier A1 is coupled to the gate of MOS transistor A10. The drain of transistor Q10 is coupled to current source $I_a$ through current divider 10. The source of transistor Q10 is coupled to the negative terminal of amplifier A1 and also coupled to ground through resistor $R_{ext}$. This external precision resistor, $R_{ext}$ is typically off the chip whereas the rest of the circuit is on the chip. The positive terminal of amplifier A1 is coupled to input voltage reference $V_{REF}$, and also coupled to the positive terminal of amplifier A2 through voltage divider 11. The voltage divider along with voltage input $V_{REF}$ sets the voltage at the positive terminal of amplifier A2 to a value $V_R$. The output voltage of amplifier A2 is set at Bias P and is coupled to resistor R. Resistor R is coupled also to ground and the negative terminal of amplifier A2 at node 1. Current source $I_b$ is also coupled to node 1.

The control circuitry is used in order to acquire the correct value of voltage Bias P to be used for the precision MOS resistor. The external precision resistor circuit is used to control the control circuitry and is already set up on the chip. The voltage $V_{REF}$ is given and sets up a constant current $I_a$ through transistor Q10, $I_a=V_{REF}/V_{ext}$. This current is forced through current divider 10 and the current subsequently reduces to $I_b$, a scaled fraction of precision current $I_a$. Voltage input of amplifier A2, $V_R$ is a scaled fraction of voltage $V_{REF}$ due to the voltage divider. Current $I_b$ is forced through replica resistor R and Bias P is adjusted until the voltage across resistor R is equal to $V_R$. Bias P is coupled to the gate of the resistive element. Thus Bias P is implemented in the actual precision MOS resistor circuit to achieve an exact resistance.

A scheme for further improved precision in the MOS resistor is illustrated in FIG. 4. By implementing a cascade of two or more MOS resistors, linearity can be improved since the drain to source voltage of each resistor is lowered. Each resistor sees a smaller drain to source voltage since the voltage difference $V_x-V_y$ is divided evenly among all the resistors in series. In the example of FIG. 4, each resistor in the circuit sees a drain to source voltage of $(V_x-V_y)/2$, and thus linearity is improved. The architecture of the example in FIG. 4 is similar to the architecture of FIG. 1, except with the addition of another PMOS source follower and another NMOS resistor. In FIG. 4, voltage input Bias P 10 is also coupled to the base of transistor M9. The gate of transistor M4 is no longer coupled to control voltage $V_y$, but is coupled to the drains of transistors M7 and M8 which are coupled to each other. The sources of transistors M7 and M8 are also coupled to each other at node 18. The gate of transistor M8 is coupled to the drain of transistor M6 and the source of transistor M4 at node 14. The gate of transistor M7 is coupled to the drain of transistor M9 and the source of transistor M10 at node 17. The drain of transistor M10 is coupled to ground. The gate of transistor M10 is coupled to the sources of transistors M7 and M8, and also coupled to control voltage $V_y$. The source of transistor M9 is coupled to supply voltage $V_{CC}$. Similar analysis from FIG. 1 can be employed for analyzing FIG. 4. Note that the source followers used to prevent "body effect" can also be implemented in FIG. 4.

Thus, a precision MOS resistor has been described.

We claim:

1. A circuit comprising:
    a resistive element having a first terminal and a second terminal, said resistive element further having a first impedance terminal and a second impedance terminal between which an impedance exists, said resistive element comprising a first and second transistor of a first conductivity type, and wherein a source of said first transistor is coupled to a source of said second transistor and a drain of said first transistor is coupled to a drain of said second transistor;
    a first biasing means coupled to said first terminal of said resistive element;
    a second biasing means coupled to said second terminal of said resistive element;
    said first and second biasing means for linearly controlling said impedance of said resistive element.

2. The circuit of claim 1 wherein said first conductivity type is N-type.

3. The circuit of claim 2 wherein said first biasing means is a source follower.

4. The circuit of claim 3 wherein said second biasing means is a source follower.

5. The circuit of claim 4 wherein said first biasing means is coupled to the gate of said first transistor of said resistive element.

6. The circuit of claim 5 wherein said second biasing means is coupled to the gate of said second transistor of said resistive element.

7. The circuit of claim 6 wherein said first biasing means is comprised of third and fourth transistors, with the drain of said third transistor coupled to the source of said fourth transistor.

8. The circuit of claim 7 wherein said second biasing means is comprised of fifth and sixth transistors, with the drain of said fifth transistor coupled to the source of said sixth transistor.

9. The circuit of claim 8 wherein said third and fourth transistors are of a second conductivity type.

10. The circuit of claim 9 wherein said fifth and sixth transistors are of said second conductivity type.

11. The circuit of claim 10 wherein said second conductivity type is P-type.

12. The circuit of claim 11 wherein a first bias voltage is coupled to the gates of said third and said fifth transistor.

13. A circuit comprising:
a resistive element;
a first biasing means coupled to a first terminal of said resistive element;
a second biasing means coupled to a second terminal of said resistive element;
said resistive element having a first impedance terminal and a second impedance terminal between which an impedance exists, said resistive element comprising a first and second transistor of a first conductivity type, wherein a source of said first transistor is coupled to a source of said second transistor and a drain of said first transistor is coupled to a drain of said second transistor;
said first and second biasing means for linearly controlling said impedance of said resistive element;
a third biasing means coupled to a third terminal of said resistive element for improving a linearity of said resistive element;
a fourth biasing means coupled to a fourth terminal of said resistive element for improving said linearity of said resistive element.

14. The circuit of claim 13 wherein said first conductivity type is N-type.

15. The circuit of claim 14 wherein said first biasing means is a source follower.

16. The circuit of claim 15 wherein said second biasing means is a source follower.

17. The circuit of claim 16 wherein said first biasing means is coupled to the gate of said second transistor of said resistive element.

18. The circuit of claim 17 wherein said second biasing means is coupled to the gate of said second transistor of said resistive element.

19. The circuit of claim 18 wherein said first biasing means is comprised of third and fourth transistors, with the drain of said third transistor coupled to the source of said fourth transistor.

20. The circuit of claim 19 wherein said second biasing means is comprised of fifth and sixth transistors, with the drain of said fifth transistor coupled to the source of said sixth transistor.

21. The circuit of claim 20 wherein said third and fourth transistors are of a second conductivity type.

22. The circuit of claim 21 wherein said fifth and sixth transistors are of said second conductivity type.

23. The circuit of claim 22 wherein said second conductivity type is P-type.

24. The circuit of claim 23 wherein said third biasing means is a source follower.

25. The circuit of claim 24 wherein said fourth biasing means is a source follower.

26. The circuit of claim 25 wherein said third biasing means is coupled to the body terminal of said second transistor in said resistive element.

27. The circuit of claim 26 wherein said fourth biasing means is coupled to the body terminal of said second transistor in said resistive element.

28. The circuit of claim 27 wherein said third biasing means is comprised of seventh and eighth transistors, with the source of said seventh transistor coupled to the drain of said eighth transistor.

29. The circuit of claim 28 wherein said fourth biasing means is comprised of ninth and tenth transistors with the source of said ninth transistor coupled to the drain of said tenth transistor.

30. The circuit of claim 29 wherein said seventh and eighth transistors are of said first conductivity type.

31. The circuit of claim 30 wherein said ninth and tenth transistors are of said first conductivity type.

32. A circuit comprising:
a first and second resistive elements, said first resistive element further having a first impedance terminal and a second impedance terminal between which a first impedance exists, said second resistive element further having a third impedance terminal and a fourth impedance terminal between which a second impedance exists, said first resistive element comprising a first and second transistor of a first conductivity type, wherein a source of said first transistor is coupled to a source of said second transistor and a drain of said first transistor is coupled to a drain of said second transistor, said second resistive element comprising a third and fourth transistor of said first conductivity type, wherein a source of said third transistor is coupled to a source of said fourth transistor and a drain of said third transistor is coupled to a drain of said fourth transistor;
a first biasing means coupled to a first terminal of said first resistive element;
a second biasing means coupled to a second terminal of said first resistive element and coupled to a first terminal of said second resistive element;
a third biasing means coupled to a second terminal of said second resistive element;
said first, second and third biasing means for linearly controlling the impedance of said first and second resistive elements.

33. The circuit of claim 32 wherein said first conductivity type is N-type.

34. The circuit of claim 33 wherein said first biasing means is a source follower.

35. The circuit of claim 34 wherein said second biasing means is a source follower.

36. The circuit of claim 35 wherein said third biasing means is a source follower.

37. The circuit of claim 36 wherein said first biasing means is coupled to the gate of said first transistor of said first resistive element.

38. The circuit of claim 37 wherein said second biasing means is coupled to the gate of said second transistor of said first resistive element and to the gate of said third transistor of said second resistive element.

39. The circuit of claim 38 wherein said third biasing means is coupled to the gate of said fourth transistor of said second resistive element.

40. The circuit of claim 39 wherein said first biasing means is comprised of fifth and sixth transistors, with the drain of said fifth transistor coupled to the source of said sixth transistor.

41. The circuit of claim 40 wherein said second biasing means is comprised of seventh and eighth transistors, with the drain of said seventh transistor coupled to the source of said eighth transistor.

42. The circuit of claim 41 wherein said third biasing means is comprised of ninth and tenth transistors, with the drain of said ninth transistor coupled to the source of said tenth transistor.

43. The circuit of claim 42 wherein said fifth and sixth transistors are of a second conductivity type.

44. The circuit of claim 43 wherein said seventh and eighth transistors are of a second conductivity type.

45. The circuit of claim 44 wherein said ninth and tenth transistors are of a second conductivity type.

46. The circuit of claim 46 wherein said second conductivity type is P-type.

47. The circuit of claim 46 wherein the gate of said eighth transistor is coupled to said source of said first transistor and to said drain of said third transistor.

* * * * *